United States Patent
Li et al.

(10) Patent No.: US 9,608,650 B1
(45) Date of Patent: Mar. 28, 2017

(54) METHOD AND DEVICE FOR CONTROLLING SINGLE-PHASE PHASE-LOCKED LOOP

(71) Applicants: BOE TECHNOLOGY GROUP CO., LTD., Beijing (CN); BEIJING BOE ENERGY TECHNOLOGY CO., LTD., Beijing (CN)

(72) Inventors: Jin Li, Beijing (CN); Xingbin Song, Beijing (CN); Xiaoyan Han, Beijing (CN)

(73) Assignees: BOE TECHNOLOGY GROUP CO., LTD., Beijing (CN); BEIJING BOE ENERGY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/087,040

(22) Filed: Mar. 31, 2016

(30) Foreign Application Priority Data

Sep. 16, 2015 (CN) .......................... 2015 1 0591702

(51) Int. Cl.
  *H03L 7/00* (2006.01)
  *H03L 7/10* (2006.01)
  *H03L 7/093* (2006.01)

(52) U.S. Cl.
  CPC .............. *H03L 7/104* (2013.01); *H03L 7/093* (2013.01)

(58) Field of Classification Search
  None
  See application file for complete search history.

(56) References Cited

U.S. PATENT DOCUMENTS

2012/0217915 A1* 8/2012 Wu .................... H02P 21/16
  318/400.07

* cited by examiner

*Primary Examiner* — Cassandra Cox
(74) *Attorney, Agent, or Firm* — Harness, Dickey & Pierce, P.L.C.

(57) ABSTRACT

The present disclosure provides a single-phase PLL controlling method and a single-phase PLL controlling device. The device includes a first FIR filter, a second FIR filter and a Park converter. The first FIR filter and the second FIR filter are configured to perform FIR filtration on a collected power grid voltage signal so as to acquire filtered signals, and output the filtered signals to the Park converter. A filtered signal Vα acquired by the first FIR filter and a filtered signal Vβ acquired by the second FIR filter form a set of virtual two-phase signals in an αβ coordinate system. The Park converter is configured to perform Park conversion on the filtered signal Vα and the filtered signal Vβ, so as to acquire a set of two-phase signals Vd and Vq in a dq coordinate system.

11 Claims, 1 Drawing Sheet

METHOD AND DEVICE FOR CONTROLLING SINGLE-PHASE PHASE-LOCKED LOOP

CROSS-REFERENCE TO RELATED APPLICATION

The present application claims a priority of the Chinese patent application No. 201510591702.6 filed on Sep. 16, 2015, which is incorporated herein by reference in its entirety.

TECHNICAL FIELD

The present disclosure relates to the field of electronic technology, in particular to a method and a device for controlling a single-phase phase-locked loop (PLL).

BACKGROUND

PLL technology, as a technology necessary for a grid-connected inverter to tracking a power grid voltage, varies depending on whether or not the inverter is a single-phase or a three-phase grid-connected inverter. There are mainly the following three phase locking ways for the single-phase grid-connected inverter: (1) acquiring information about a period and a phase by detecting a voltage zero-crossing point; (2) a PLL technology based on a multiplier; and (3) a phase-locked loop technology based on a three-phase phase-locked loop controlling mode.

For a basic concept of the three-phase PLL controlling mode, a three-phase power grid is created artificially, and then the calculation is performed in accordance with the three-phase PLL controlling mode. Based on the basic concept of the three-phase PLL controlling mode, two virtual phases are created, and then a three-phase signal is converted into a signal in a dq rotating coordinate system. In the related art, the methods for creating the two virtual phases in the three-phase PLL controlling mode include a method of delaying by a ¼ period, a differential method, and so on, and these methods may be used to track the power grid when the power grid is in stable state. However, when the power grid is in a non-ideal state, the phase locking ability will be insufficient.

SUMMARY

An object of the present disclosure is to improve the phase locking ability when the power grid is in the non-ideal state.

In one aspect, the present disclosure provides in some embodiments a single-phase PLL controlling device, including a first finite impulse response (FIR) filter, a second FIR filter and a Park converter. The first FIR filter and the second FIR filter are both connected to the Park converter, and configured to perform FIR filtration on a collected power grid voltage signal so as to acquire filtered signals, and output the filtered signals into the Park converter. A filtered signal Vα acquired by the first FIR filter and a filtered signal Vβ acquired by the second FIR filter form a set of virtual two-phase signals in an αβ coordinate system. The Park converter is configured to perform Park conversion on the filtered signal Vα and the filtered signal Vβ, so as to acquire a set of two-phase signals Vd and Vq in a dq coordinate system.

Alternatively, both an order of the first FIR filter and an order of the second FIR filter are 4M, wherein M represents a positive integer. When i is less than or equal to 3M, an $i^{th}$ filter coefficient in a filter coefficient sequence of the first FIR filter is identical to an $(i+M)^{th}$ filter coefficient in a filter coefficient sequence of the second FIR filter. When i is greater than 3M and less than 4M, the $i^{th}$ filter coefficient in the filter coefficient sequence of the first FIR filter is identical to an $(i-3M)^{th}$ filter coefficient in the filter coefficient sequence of the second FIR filter.

Alternatively, the single-phase PLL controlling device further includes a compensation module connected to the Park converter and configured to generate a phase-locked angle for a current control period in accordance with the Vq signal outputted by the Park converter within the current control period. The Park converter is configured to perform the Park conversion on the filtered signal Vα and the filtered signal Vβ in accordance with a phase-locked angle generated by the compensation module within a previous control period, so as to acquire the two-phase signals Vd and Vq in the dq coordinate system.

Alternatively, the Park converter is configured to perform the Park conversion on the filtered signal Vα and the filtered signal Vβ using a following formula, so as to acquire the two-phase signals Vd and Vq in the dq coordinate system:

$$\begin{bmatrix} V_d \\ V_q \end{bmatrix} = \begin{bmatrix} \cos\theta^* & \sin\theta^* \\ -\sin\theta^* & \cos\theta^* \end{bmatrix} \begin{bmatrix} V_\alpha \\ V_\beta \end{bmatrix}, \text{ where } \theta^* = \theta + \frac{\pi}{2},$$

and θ represents the phase-locked angle generated by the compensation module within the previous control period.

Alternatively, the compensation module includes a phase detector, a linear controller, a feedforward controller and a voltage-controlled oscillator. The phase detector is connected to the Park converter and the linear controller, and configured to calculate a difference between the Vq signal from the Park converter and a fixed value, and input the difference into the linear controller. The linear controller is connected to the feedforward controller, and configured to calculate a phase-locked angle frequency compensation value in accordance with the difference from the phase detector, and input the phase-locked angle frequency compensation value into the feedforward controller. The feedforward controller is connected to the voltage-controlled oscillator, and configured to calculate a sum value of the phase-locked angle frequency compensation value from the linear controller and a fixed phase-locked angle frequency, and input the sum value to the voltage-controlled oscillator. The voltage-controlled oscillator is configured to generate a phase-locked angle in accordance with the sum value from the feedforward controller.

In another aspect, the present disclosure provides in some embodiments a method for controlling a single-phase PLL, including steps of: filtering a collected power grid voltage signal using a first FIR filtering algorithm and a second FIR filtering algorithm, so as to acquire filtered signals respectively, a filtered signal Vα acquired by using the first FIR filtering algorithm and a filtered signal Vβ acquired by using the second FIR filtering algorithm form a set of virtual two-phase signals in an αβ coordinate system; and performing Park conversion on the filtered signal Vα and the filtered signal Vβ using a Park conversion algorithm, so as to acquire a set of two-phase signals Vd and Vq in a dq coordinate system.

Alternatively, both a filtering order for the first FIR filtering algorithm and a filtering order for the second FIR filtering algorithm are 4M. When i is less than or equal to 3M, an $i^{th}$ filter coefficient in a filter coefficient sequence of a first FIR filter is identical to an $(i+M)^{th}$ filter coefficient in a filter coefficient sequence of a second FIR filter. When i is greater than 3M and less than 4M, the $i^{th}$ filter coefficient in the filter coefficient sequence of the first FIR filter is identical to an $(i-3M)^{th}$ filter coefficient in the filter coefficient sequence of the second FIR filter.

Alternatively, the method further includes generating a phase-locked angle for a current control period in accordance with the Vq signal acquired within the current control period. The step of performing the Park conversion on the filtered signal Vα and the filtered signal Vβ using the Park conversion algorithm so as to acquire a set of the two-phase signals Vd and Vq in the dq coordinate system includes a step of: performing the Park conversion on the filtered signal Vα and the filtered signal Vβ in accordance with a phase-locked angle generated within a previous control period, so as to acquire a set of the two-phase signals Vd and Vq in the dq coordinate system.

Alternatively, the step of performing the Park conversion on the filtered signal Vα and the filtered signal Vβ in accordance with a phase-locked angle generated within a previous control period, so as to acquire a set of the two-phase signals Vd and Vq in the dq coordinate system includes a step of: performing the Park conversion on the filtered signal Vα and the filtered signal Vβ using a following formula, so as to acquire a set of the two-phase signals Vd and Vq in the dq coordinate system:

$$\begin{bmatrix} V_d \\ V_q \end{bmatrix} = \begin{bmatrix} \cos\theta^* & \sin\theta^* \\ -\sin\theta^* & \cos\theta^* \end{bmatrix} \begin{bmatrix} V_\alpha \\ V_\beta \end{bmatrix}, \text{ where } \theta^* = \theta + \frac{\pi}{2},$$

and θ represents the phase-locked angle generated within the previous control period.

Alternatively, the step of generating the phase-locked angle for the current control period in accordance with the Vq signal acquired within the current control period includes: calculating a difference between the Vq signal and a fixed value; calculating a phase-locked angle frequency compensation value using a linear algorithm in accordance with the difference; calculating a sum value of the phase-locked angle frequency compensation value and a fixed phase-locked angle frequency; and generating the phase-locked angle in accordance with the sum value.

According to the single-phase PLL controlling device and the method for controlling the single-phase PLL in the embodiments of the present disclosure, the FIR filters are used to create the two virtual phases, and meanwhile perform filtration on an original signal. As a result, it is able to prevent the tracking of a power grid fundamental wave component from being adversely affected by a noise.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
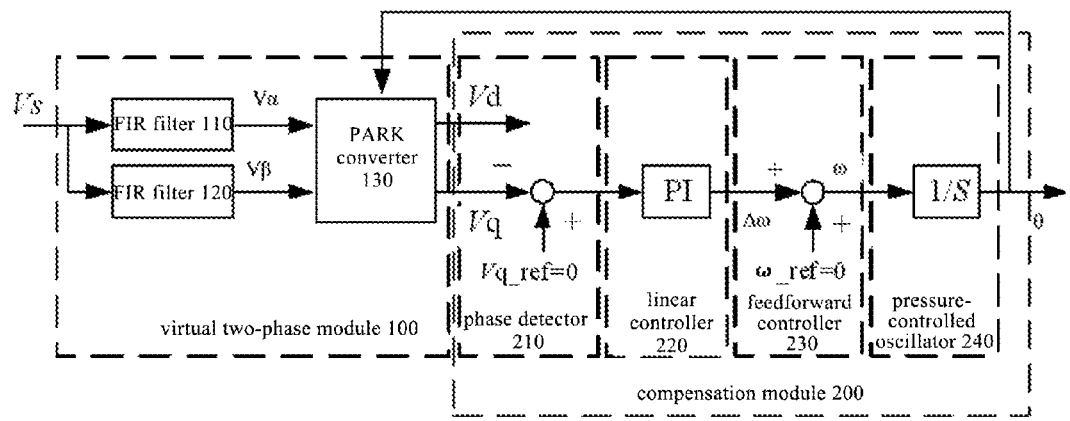
FIG. 1 is a schematic view showing a single-phase PLL controlling device according to at least one embodiment of the present disclosure.

The present disclosure provides in at least one embodiment a single-phase PLL controlling device which, as shown in FIG. 1, includes a virtual two-phase module 100. The virtual two-phase module 100 includes a FIR filter 110, a FIR filter 120 and a Park converter 130. The FIR filter 110 and the FIR filter 120 have their output ends connected to the Park converter 130, and are configured to perform FIR filtration on a collected power grid voltage signal Vs so as to acquire filtered signals, and output the filtered signals into the Park converter 130. A filtered signal Vα acquired by the FIR filter 110 and a filtered signal Vβ acquired by the FIR filter 120 form a set of virtual two-phase signals in an αβ coordinate system. The Park converter 130 is configured to perform Park conversion on the filtered signal Vα and the filtered signal Vβ, so as to acquire a set of two-phase signals Vd and Vq in a dq coordinate system.

According to the single-phase PLL controlling device in the embodiments of the present disclosure, the FIR filters are used to create the two virtual phases, and meanwhile perform filtration on an original signal. As a result, it is able to prevent the tracking of a power grid fundamental wave component from being adversely affected by a noise.

During the implementation, for example, each of an order of the FIR filter 110 and an order of the FIR filter 120 is 4M, wherein M represents a positive integer. When i is less than or equal to 3M, an $i^{th}$ filter coefficient in a filter coefficient sequence of the FIR filter 110 is identical to an $(i+M)^{th}$ filter coefficient in a filter coefficient sequence of the FIR filter 120. When i is greater than 3M and less than 4M, the $i^{th}$ filter coefficient in the filter coefficient sequence of the FIR filter 110 is identical to an $(i-3M)^{th}$ filter coefficient in the filter coefficient sequence of the FIR filter 120.

During the implementation, the FIR filter is usually expressed as:

$$y(n) = \sum_{k=0}^{N-1} b_k \cdot x(n-k),$$

where x(n−k) represents an input signal, $b_k$ represents a filtering coefficient, y(n) represents an output signal, N represents the order of the filter, and M=4M. For a power grid voltage signal in a sinusoidal form, the filtering coefficients $b_k$ in the above formula may be arranged appropriately and used as the filtering coefficients of the FIR filter 110 and the FIR filter 120, so as to acquire the virtual two-phase signals Vα and Vβ respectively. For example, M in the above formula may be replaced with M−2N, so as to acquire the output signal from the FIR filter 110, and M in the above formula may be replaced with M−N', so as to acquire the output signal from the FIR filter 120.

During the implementation, referring to FIG. 1, the single-phase PLL controlling device may further include a compensation module 200, an input end of the compensation module 200 is connected to one output end of the Park converter 130 and an output end of the compensation module 200 is connected to one input end of the Park converter 130. The compensation module 200 is configured to generate a phase-locked angle for a current control period in accordance with the Vq signal outputted by the Park converter 130 within the current control period, and input the phase-locked angle into the Park converter 130 via the output end of the compensation module 200. The Park converter 130 is configured to perform the Park conversion on the filtered signal Vα and the filtered signal Vβ in accordance with a phase-locked angle generated by the compensation module 200 within a previous control period so as to acquire the two-phase signals Vd and Vq in the dq coordinate system, and input the generated Vq signal into the input end of the compensation module 200.

During the implementation, the Park converter 130 may perform the Park conversion on the filtered signal Vα and the filtered signal Vβ using a following formula, so as to acquire the two-phase signals Vd and Vq in the dq coordinate system:

$$\begin{bmatrix} V_d \\ V_q \end{bmatrix} = \begin{bmatrix} \cos\theta^* & \sin\theta^* \\ -\sin\theta^* & \cos\theta^* \end{bmatrix} \begin{bmatrix} V_\alpha \\ V_\beta \end{bmatrix}, \text{ where } \theta^* = \theta + \frac{\pi}{2},$$

and θ represents the phase-locked angle generated by the compensation module 200 within the previous control period.

During the implementation, referring to FIG. 1, the compensation module 200 may include a phase detector 210, a linear controller 220, a feedforward controller 230 and a voltage-controlled oscillator 210.

The phase detector 210 is connected to the output end of the Park converter 130 and an input end of the linear controller 220, and configured to calculate a difference between the Vq signal from the Park converter 130 and a fixed value, and input the difference into the linear controller 220. The linear controller 220 has its output end connected to an input end of the feedforward controller 230, and it is configured to calculate a phase-locked angle frequency compensation value Δω in accordance with the difference from the phase detector 210, and input the phase-locked angle frequency compensation value Δω into the feedforward controller 230. The feedforward controller 230 has its output end connected to an input end of the voltage-controlled oscillator 240, and it is configured to calculate a sum value ω of the phase-locked angle frequency compensation value Δω from the linear controller 220 and a fixed phase-locked angle frequency ω_ref, and input the sum value ω to the voltage-controlled oscillator 240. The voltage-controlled oscillator 240 is configured to generate a phase-locked angle θ in accordance with the sum value ω from the feedforward controller 230.

During the implementation, the phase-locked angle frequency compensation value Δω may be 100π. In addition, the linear controller 220 may be a proportional integral controller.

Figure 2:
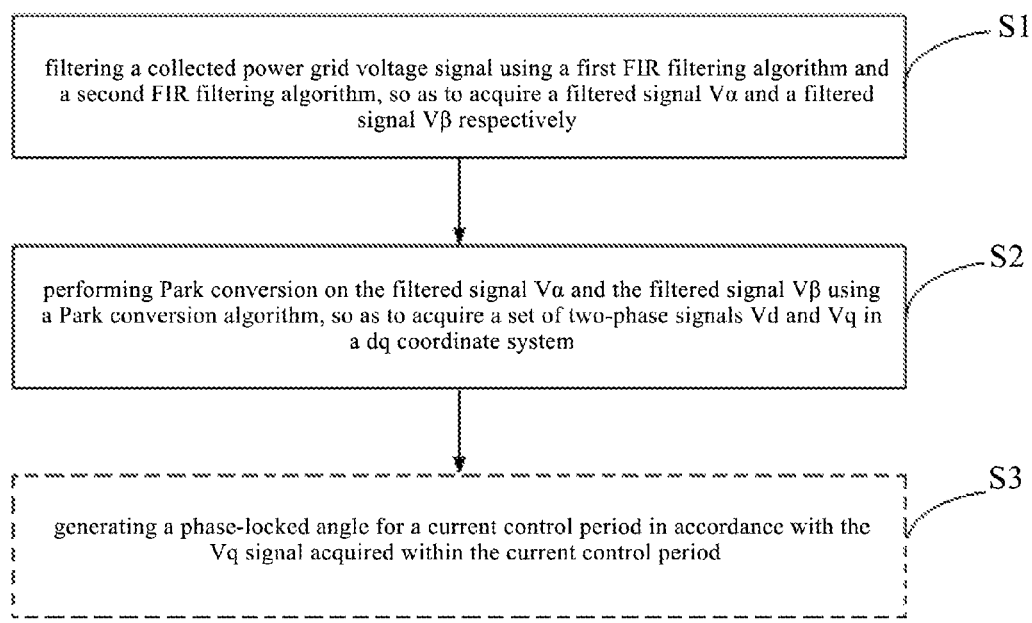
FIG. 2 is a flow chart of a single-phase PLL controlling method according to at least one embodiment of the present disclosure.

The present disclosure further provides in at least one embodiment a single-phase PLL controlling method which, as shown in FIG. 2, may include: Step S1 of filtering a collected power grid voltage signal using a first FIR filtering algorithm and a second FIR filtering algorithm, so as to acquire filtered signals respectively, a filtered signal Vα acquired by using the first FIR filtering algorithm and a filtered signal Vβ acquired by using the second FIR filtering algorithm forms a set of virtual two-phase signals in an αβ coordinate system; and Step S2 of performing Park conversion on the filtered signal Vα and the filtered signal Vβ using a Park conversion algorithm, so as to acquire a set of two-phase signals Vd and Vq in a dq coordinate system.

According to the single-phase PLL controlling method in the embodiments of the present disclosure, the first FIR filtering algorithm and the second FIR filtering algorithm are used to create two virtual phases, and meanwhile perform filtration on an original signal. As a result, it is able to prevent the tracking of a power grid fundamental wave component from being adversely affected by a noise.

During the implementation, in Step S1, for example, both a filtering order for the first FIR filtering algorithm and a filtering order for the second FIR filtering algorithm are 4M. When i is less than or equal to 3M, an $i^{th}$ filter coefficient in a filter coefficient sequence of a first FIR filtering algorithm is identical to an $(i+M)^{th}$ filter coefficient in a filter coefficient sequence of a second FIR filtering algorithm. When i is greater than 3M and less than 4M, the $i^{th}$ filter coefficient in the filter coefficient sequence of the first FIR filtering algorithm is identical to an $(i-3M)^{th}$ filter coefficient in the filter coefficient sequence of the second FIR filtering algorithm.

During the implementation, the method further includes Step S3 of generating a phase-locked angle for a current control period in accordance with the Vq signal acquired within the current control period. At this time, Step S2 may include performing the Park conversion on the filtered signal Vα and the filtered signal Vβ in accordance with a phase-locked angle generated within a previous control period, so as to acquire a set of the two-phase signals Vd and Vq in the dq coordinate system.

Further, Step S2 may include performing the Park conversion on the filtered signal Vα and the filtered signal Vβ using a following formula, so as to acquire a set of the two-phase signals Vd and Vq in the dq coordinate system:

$$\begin{bmatrix} V_d \\ V_q \end{bmatrix} = \begin{bmatrix} \cos\theta^* & \sin\theta^* \\ -\sin\theta^* & \cos\theta^* \end{bmatrix} \begin{bmatrix} V_\alpha \\ V_\beta \end{bmatrix}, \text{ where } \theta^* = \theta + \frac{\pi}{2},$$

and θ represents the phase-locked angle generated within the previous control period.

During the implementation, Step S3 may include calculating a difference between the Vq signal and a fixed value; calculating a phase-locked angle frequency compensation value using a linear algorithm in accordance with the difference; calculating a sum value of the phase-locked angle frequency compensation value and a fixed phase-locked angle frequency; and generating the phase-locked angle in accordance with the sum value.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A device for controlling a single-phase phase-locked loop (PLL), comprising a first finite impulse response (FIR) filter, a second FIR filter and a Park converter, wherein
each of the first FIR filter and the second FIR filter is connected to the Park converter, and configured to perform FIR filtration on a collected power grid voltage signal so as to acquire a filtered signal, and output the filtered signal to the Park converter;
a first filtered signal (Vα) outputted by the first FIR filter and a second filtered signal (Vβ) outputted by the second FIR filter form a set of virtual two-phase signals in an αβ coordinate system; and
the Park converter is configured to perform Park conversion on the first filtered signal (Vα) and the second filtered signal (Vβ), so as to output a set of two-phase signals comprising a first two-phase signal (Vd) and a second two-phase signal (Vq) in a dq coordinate system.

2. The device according to claim 1, wherein
both an order of the first FIR filter and an order of the second FIR filter are 4M, i represents a sequence number of a filter coefficient in a filter coefficient sequence, and M represents a positive integer;
when i is less than or equal to 3M, an $i^{th}$ filter coefficient in the filter coefficient sequence of the first FIR filter is identical to an $(i+M)^{th}$ filter coefficient in a filter coefficient sequence of the second FIR filter; and
when i is greater than 3M and less than 4M, the $i^{th}$ filter coefficient in the filter coefficient sequence of the first FIR filter is identical to an $(i-3M)^{th}$ filter coefficient in the filter coefficient sequence of the second FIR filter.

3. The device according to claim 1, further comprising:
a compensation module connected to the Park converter and configured to generate a phase-locked angle for a current control period in accordance with the second two-phase signal (Vq) outputted by the Park converter within the current control period,
wherein the Park converter is configured to perform the Park conversion on the first filtered signal (Vα) and the second filtered signal (Vβ), in accordance with a phase-locked angle generated by the compensation module within a previous control period, so as to output the first two-phase signals (Vd), and the second two-phase signal (Vq) in the dq coordinate system.

4. The device according to claim 3, wherein the Park converter is configured to perform the Park conversion on the first filtered signal (Vα) and the second filtered signal (Vβ) using a following formula, so as to output the first two-phase signal (Vd) and the second two-phase signal (Vq) in the dq coordinate system:

$$\begin{bmatrix} V_d \\ V_q \end{bmatrix} = \begin{bmatrix} \cos q^* & \sin q^* \\ -\sin q^* & \cos q^* \end{bmatrix} \begin{bmatrix} V_a \\ V_b \end{bmatrix}, \text{ where } q^* = q + \frac{p}{2}, \text{ and}$$

q represents the phase-locked angle generated by the compensation module within the previous control period.

5. The device according to claim 4, wherein the compensation module comprises a phase detector, a linear controller, a feedforward controller and a voltage-controlled oscillator, wherein:
the phase detector is connected to the Park converter and the linear controller, and configured to calculate a difference between the second two-phase signal (Vq) outputted by the Park converter and a fixed value, and output the difference to the linear controller;
the linear controller is connected to the feedforward controller, and configured to calculate a phase-locked angle frequency compensation value in accordance with the difference outputted by the phase detector, and output the phase-locked angle frequency compensation value to the feedforward controller;
the feedforward controller is connected to the voltage-controlled oscillator, and configured to calculate a sum value of the phase-locked angle frequency compensation value outputted by the linear controller and a fixed phase-locked angle frequency, and output the sum value to the voltage-controlled oscillator; and
the voltage-controlled oscillator is configured to generate a phase-locked angle in accordance with the sum value outputted by the feedforward controller.

6. The device according to claim 5, wherein the linear controller is a proportional integral controller.

7. A method for controlling a single-phase phase-locked loop (PLL), comprising steps of:
filtering a collected power grid voltage signal using a first Finite Impulse Response (FIR) filtering algorithm and a second FIR filtering algorithm, so as to acquire filtered signals respectively, wherein a first filtered signal (Vα) acquired by using the first FIR filtering algorithm and a second filtered signal (Vβ) acquired by using the second FIR filtering algorithm form a set of virtual two-phase signals in an αβ coordinate system; and
performing Park conversion on the first filtered signal (Vα) and the second filtered signal (Vβ) using a Park conversion algorithm, so as to acquire a set of two-phase signals comprising a first two-phase signal (Vd) and a second two-phase signal (Vq) in a dq coordinate system.

8. The method according to claim 7, wherein:
both a filtering order for the first FIR filtering algorithm and a filtering order for the second FIR filtering algorithm are 4M, i represents a sequence number of a filter coefficient in a filter coefficient sequence, and M represents a positive integer;
when i is less than or equal to 3M, an $i^{th}$ filter coefficient in the filter coefficient sequence of a first FIR filter is identical to an $(i+M)^{th}$ filter coefficient in a filter coefficient sequence of a second FIR filter; and
when i is greater than 3M and less than 4M, the $i^{th}$ filter coefficient in the filter coefficient sequence of the first FIR filter is identical to an $(i-3M)^{th}$ filter coefficient in the filter coefficient sequence of the second FIR filter.

9. The method according to claim 7, further comprising:
generating a phase-locked angle for a current control period in accordance with the second two-phase signal (Vq) acquired within the current control period,
wherein the step of performing the Park conversion on the first filtered signal (Vα) and the second filtered signal (Vβ) using the Park conversion algorithm so as to acquire the set of two-phase signals comprising the first two-phase signal (Vd) and the second two-phase signal (Vq) in the dq coordinate system comprises a step of:
performing the Park conversion on the first filtered signal (Vα) and the second filtered signal (Vβ) in accordance with a phase-locked angle generated within a previous control period, so as to acquire the set of two-phase signals comprising the first two-phase signal (Vd) and the second two-phase signal (Vq) in the dq coordinate system.

10. The method according to claim 9, wherein the step of performing the Park conversion on the first filtered signal (Vα) and the second filtered signal (Vβ) in accordance with a phase-locked angle generated within a previous control period, so as to acquire the set of two-phase signals comprising the first two-phase signal (Vd) and the second two-phase signal (Vq) in the dq coordinate system includes a step of:

performing the Park conversion on the first filtered signal (Vα) and the second filtered signal (Vβ) using a following formula, so as to acquire the set of two-phase signals comprising the first two-phase signal (Vd) and the second two-phase signal (Vq) in the dq coordinate system:

$$\begin{bmatrix} V_d \\ V_q \end{bmatrix} = \begin{bmatrix} \cos q^* & \sin q^* \\ -\sin q^* & \cos q^* \end{bmatrix} \begin{bmatrix} V_a \\ V_b \end{bmatrix}, \text{ where } q^* = q + \frac{p}{2}, \text{ and }$$

q represents the phase-locked angle generated within the previous control period.

11. The method according to claim 10, wherein the step of generating the phase-locked angle for the current control period in accordance with the second two-phase signal (Vq) acquired within the current control period comprises steps of:

calculating a difference between the second two-phase signal (Vq) and a fixed value;

calculating a phase-locked angle frequency compensation value using a linear algorithm in accordance with the difference;

calculating a sum value of the phase-locked angle frequency compensation value and a fixed phase-locked angle frequency; and generating the phase-locked angle in accordance with the sum value.

* * * * *